(12) United States Patent
Shin

(10) Patent No.: US 12,015,400 B2
(45) Date of Patent: Jun. 18, 2024

(54) ROTARY SWITCH DEVICE FOR VEHICLE

(71) Applicants: Hyundai Motor Company, Seoul (KR); Kia Corporation, Seoul (KR)

(72) Inventor: Sang Hoon Shin, Gyeonggi-do (KR)

(73) Assignees: Hyundai Motor Company, Seoul (KR); Kia Corporation, Seoul (KR)

( * ) Notice: Subject to any disclaimer, the term of this patent is extended or adjusted under 35 U.S.C. 154(b) by 410 days.

(21) Appl. No.: 17/480,544

(22) Filed: Sep. 21, 2021

(65) Prior Publication Data

US 2022/0209772 A1 Jun. 30, 2022

(30) Foreign Application Priority Data

Dec. 30, 2020 (KR) ........................ 10-2020-0188349

(51) Int. Cl.
| | |
|---|---|
| *H03K 17/97* | (2006.01) |
| *B60K 35/00* | (2024.01) |
| *H01H 19/02* | (2006.01) |
| *H01H 19/14* | (2006.01) |
| *H01H 36/00* | (2006.01) |

(52) U.S. Cl.
CPC ............. *H03K 17/97* (2013.01); *B60K 35/00* (2013.01); *H01H 19/025* (2013.01); *H01H 19/14* (2013.01); *H01H 36/00* (2013.01); *H01H 2231/026* (2013.01); *H03K 2217/94068* (2013.01)

(58) Field of Classification Search
None
See application file for complete search history.

(56) References Cited

U.S. PATENT DOCUMENTS

| | | | |
|---|---|---|---|
| 9,093,237 B2* | 7/2015 | Bondar | H03K 17/97 |
| 2007/0181410 A1* | 8/2007 | Baier | F24C 7/082 |
| | | | 200/17 R |
| 2021/0162866 A1* | 6/2021 | Alu | H03K 17/97 |
| 2022/0234444 A1* | 7/2022 | Hosokawa | G06F 3/0338 |

FOREIGN PATENT DOCUMENTS

DE 102005049995 A1 * 4/2007 ............. F24C 7/082

* cited by examiner

*Primary Examiner* — Bernard Rojas
(74) *Attorney, Agent, or Firm* — Fox Rothschild LLP

(57) ABSTRACT

A rotary switch device for a vehicle includes a rotary dial module including a plurality of sensors, a material configured to react to a magnetic force, and a base module that generates a magnetic force greater than or equal to a threshold value to enable the rotary dial module to be attached to the base module and transmits detection results from the plurality of sensors included in the rotary dial module to an electronic device inside the vehicle when the rotary dial module is attached to the base module.

12 Claims, 9 Drawing Sheets

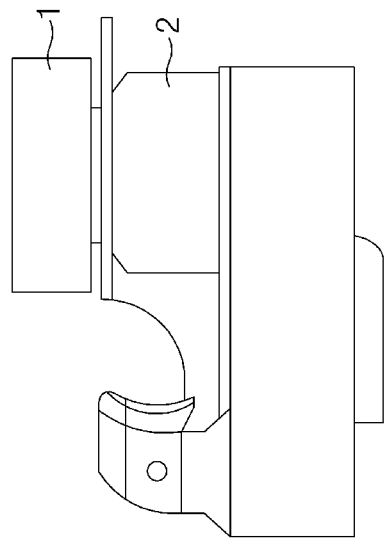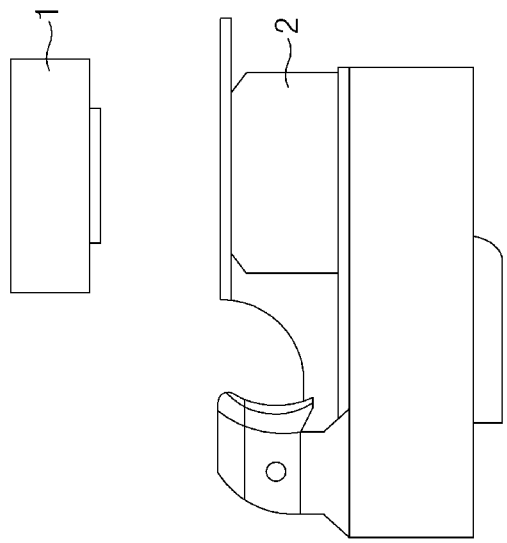
FIG. 1

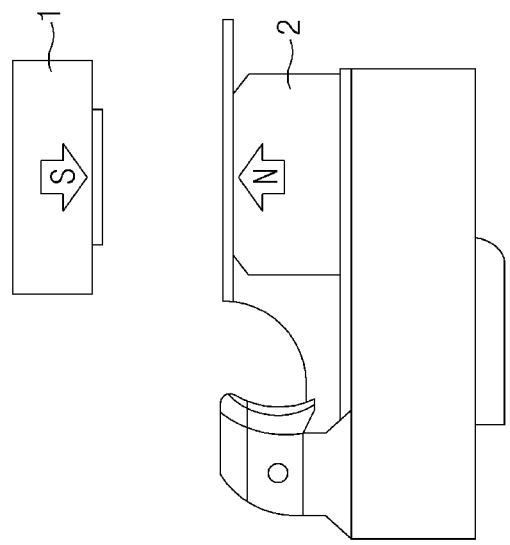
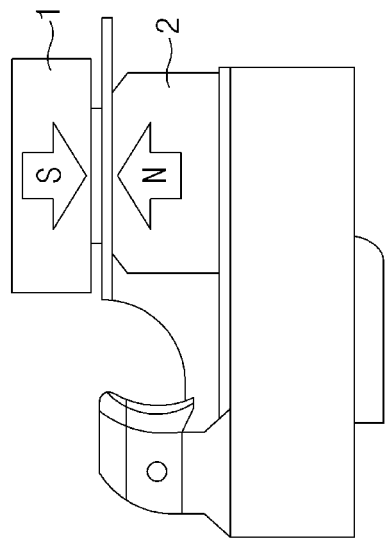
FIG.2

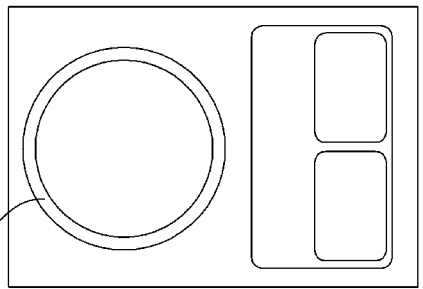
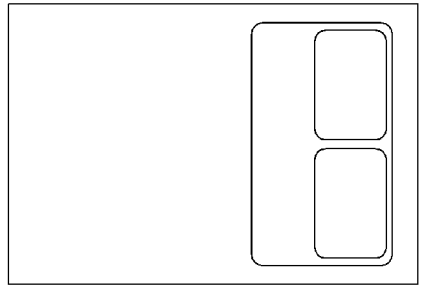
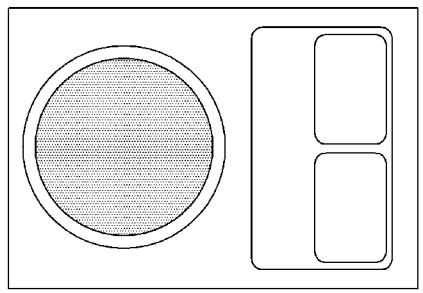
FIG. 3B

| REGION | ATTACHMENT (DOCKING) | ATTACHMENT (DOCKING) + OPERATION | DETACHMENT (UNDOCKING) | NOTE |
|---|---|---|---|---|
| ① | > a | > a | < a | DETERMINATION OF ATTACHMENT < DETACHMENT |
| ② | — | Bn | — | DETERMINATION OF OPERATIONAL FEELING |
| ①+② | > a | > a+Bn | < a | |

Bn : GENERATION OF VARIOUS ATTACHMENT FORCES (MAGNETIC FORCES)

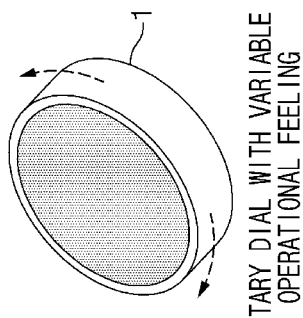

ROTARY DIAL WITH VARIABLE OPERATIONAL FEELING

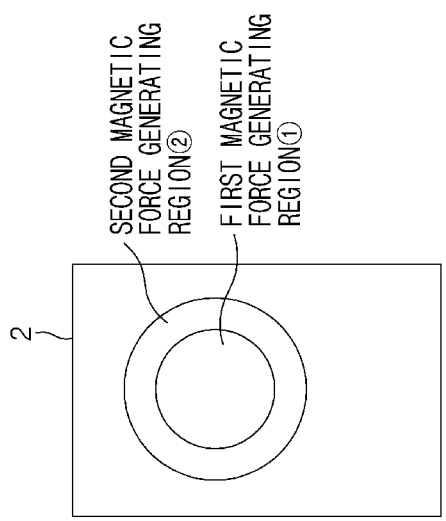

SECOND MAGNETIC FORCE GENERATING REGION②
FIRST MAGNETIC FORCE GENERATING REGION①

FIG.6

ROTARY SWITCH DEVICE FOR VEHICLE

CROSS-REFERENCE TO RELATED APPLICATION

This application claims under 35 U.S.C. § 119(a) the benefit of Korean Patent Application No. 10-2020-0188349, filed in the Korean Intellectual Property Office on Dec. 30, 2020, the entire contents of which are incorporated herein by reference.

BACKGROUND

(a) Technical Field

The present disclosure relates to a detachable rotary switch device for a vehicle.

(b) Description of the Related Art

In addition to a basic driving function, a vehicle also typically performs various functions such as an audio function, a video function, a navigation function, an air conditioning control function, a seat control function, and a lighting control function.

With the rapid development of electronic control technology, various devices that were operated in a mechanical manner in a vehicle have been driven in an electric manner for reasons such as convenience and safety of a driver, and vehicle systems are becoming more advanced and incorporating additional technology.

In recent years, research has been conducted on input devices enabling a driver to easily call and execute various functions of the vehicle to enable the driver to safely and simply operate the various functions.

In addition, as the development of autonomous driving continues and seat rotation in a vehicle becomes possible, research is being conducted to secure accessibility and operability of buttons of an indoor operation system capable of operating various functions of the vehicle.

SUMMARY

An aspect of the present disclosure provides a rotary dial type switch device capable of stable attachment and easy detachment.

The technical problems of the present disclosure are not limited to the aforementioned problems, and any other technical problems not mentioned herein will be clearly understood from the following description by those skilled in the art.

The technical problems to be solved by the present inventive concept are not limited to the aforementioned problems, and any other technical problems not mentioned herein will be clearly understood from the following description by those skilled in the art to which the present disclosure pertains.

According to an aspect of the present disclosure, a rotary switch device for a vehicle includes a rotary dial module including a plurality of sensors and a material configured to react to a magnetic force and a base module that generates a magnetic force greater than or equal to a threshold value to enable the rotary dial module to be attached to the base module and transmits detection results from the plurality of sensors included in the rotary dial module to an electronic device inside the vehicle when the rotary dial module is attached to the base module.

According to an aspect of the present disclosure, a method for operating a rotary switch device for a vehicle includes an attachment force setting step of generating and maintaining a magnetic force greater than or equal to a threshold value when a rotary dial module is attached to an upper portion of a base module, an attachment maintenance determination step of determining whether the vehicle is in an autonomous driving mode or a detachment condition is satisfied, a sensor activation step of activating sensors included in the rotary dial module and receiving detection results of the activated sensors, when it is determined in the attachment maintenance determination step that the vehicle is in an autonomous driving mode or the detachment condition is satisfied, a detachment situation determination step of determining a detachment situation based on the detection results in the sensor activation step, and a first attachment force change step of changing the magnetic force to be less than the threshold value when the detachment situation is determined in the detachment situation determination step.

BRIEF DESCRIPTION OF THE DRAWINGS

The above and other objects, features and advantages of the present disclosure will be more apparent from the following detailed description taken in conjunction with the accompanying drawings:

FIG. 1 is a diagram showing a configuration of a rotary switch device for a vehicle according to an embodiment of the present disclosure;

FIG. 2 is a view for describing attachment and detachment of a rotary switch device for a vehicle according to an embodiment of the present disclosure;

FIGS. 3A and 3B are diagrams for describing a rotary dial module and a base module included in a rotary switch device for a vehicle according to an embodiment of the present disclosure;

FIG. 6 is a view for describing a base module equipped with a rotary switch device for a vehicle according to another embodiment of the present disclosure;

DETAILED DESCRIPTION

Figure 3A:
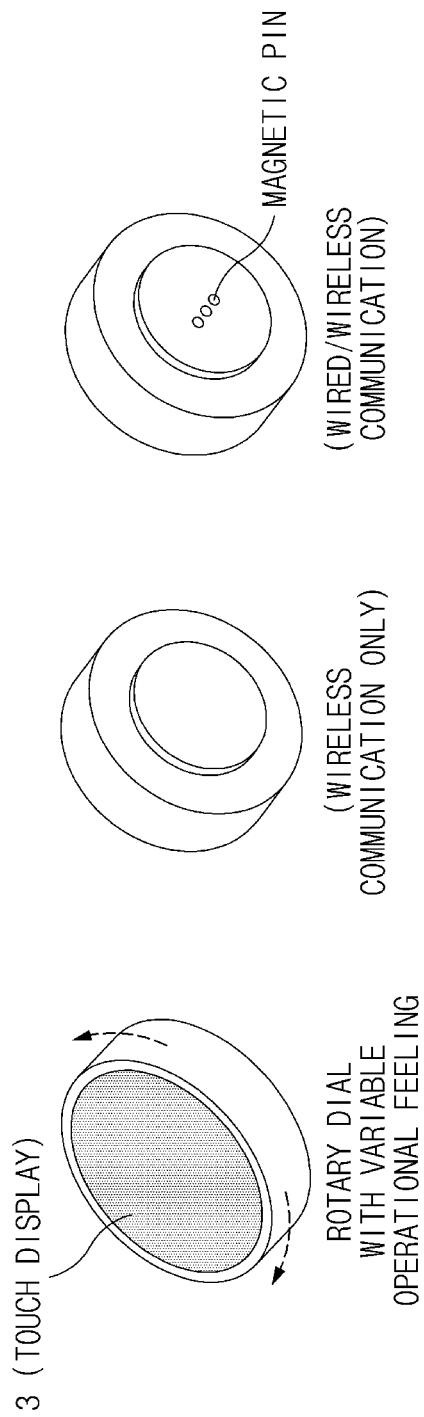

It is understood that the term "vehicle" or "vehicular" or other similar term as used herein is inclusive of motor vehicles in general such as passenger automobiles including sports utility vehicles (SUV), buses, trucks, various commercial vehicles, watercraft including a variety of boats and ships, aircraft, and the like, and includes hybrid vehicles, electric vehicles, plug-in hybrid electric vehicles, hydrogen-powered vehicles and other alternative fuel vehicles (e.g. fuels derived from resources other than petroleum). As referred to herein, a hybrid vehicle is a vehicle that has two or more sources of power, for example both gasoline-powered and electric-powered vehicles.

The terminology used herein is for the purpose of describing particular embodiments only and is not intended to be limiting of the disclosure. As used herein, the singular forms "a," "an" and "the" are intended to include the plural forms as well, unless the context clearly indicates otherwise. It will be further understood that the terms "comprises" and/or "comprising" when used in this specification, specify the presence of stated features, integers, steps, operations, elements, and/or components, but do not preclude the presence or addition of one or more other features, integers, steps, operations, elements, components, and/or groups thereof. As used herein, the term "and/or" includes any and all combinations of one or more of the associated listed items. Throughout the specification, unless explicitly described to the contrary, the word "comprise" and variations such as "comprises" or "comprising" will be understood to imply the inclusion of stated elements but not the exclusion of any other elements. In addition, the terms "unit", "-er", "-or", and "module" described in the specification mean units for processing at least one function and operation, and can be implemented by hardware components or software components and combinations thereof.

Further, the control logic of the present disclosure may be embodied as non-transitory computer readable media on a computer readable medium containing executable program instructions executed by a processor, controller or the like. Examples of computer readable media include, but are not limited to, ROM, RAM, compact disc (CD)-ROMs, magnetic tapes, floppy disks, flash drives, smart cards and optical data storage devices. The computer readable medium can also be distributed in network coupled computer systems so that the computer readable media is stored and executed in a distributed fashion, e.g., by a telematics server or a Controller Area Network (CAN).

Hereinafter, some embodiments of the present disclosure will be described in detail with reference to the exemplary drawings. In adding the reference numerals to the components of each drawing, it should be noted that the identical or equivalent component is designated by the identical numeral even when they are displayed on other drawings. Further, in describing the embodiment of the present disclosure, a detailed description of well-known features or functions will be ruled out in order not to unnecessarily obscure the gist of the present disclosure.

In describing the components of the embodiment according to the present disclosure, terms such as first, second, "A", "B", (a), (b), and the like may be used. These terms are merely intended to distinguish one component from another component, and the terms do not limit the nature, sequence or order of the constituent components. Unless otherwise defined, all terms used herein, including technical or scientific terms, have the same meanings as those generally understood by those skilled in the art to which the present disclosure pertains. Such terms as those defined in a generally used dictionary are to be interpreted as having meanings equal to the contextual meanings in the relevant field of art, and are not to be interpreted as having ideal or excessively formal meanings unless clearly defined as having such in the present application.

Embodiments of the present disclosure will be described below in detail with reference to FIGS. 1 to 8.

FIG. 1 is a view showing a configuration of a rotary switch device for a vehicle according to an embodiment of the present disclosure Referring to FIG. 1, a rotary switch device according to an embodiment of the present disclosure may be implemented inside a vehicle. In this case, the rotary switch device may be integrally formed with internal control units of the vehicle, or may be implemented as a separate device and connected to the control units of the vehicle by separate connection means.

Referring to FIG. 1, the rotary switch device for a vehicle according to an embodiment of the present disclosure may include a rotary dial module 1 and a base module 2.

As shown in FIG. 1, the rotary dial module 1 and the base module 2 may be configured to be detachably attached to each other.

The rotary dial module 1 and the base module 2 may be arranged such that the rotary dial module 1 is detachably attached to an upper portion of the base module 2.

FIG. 2 is a view for describing attachment and detachment of a rotary switch device for a vehicle according to an embodiment of the present disclosure.

The left figure of FIG. 2 shows that the rotary dial module 1 is attached to the upper portion of the base module 2, and the right figure of FIG. 2 shows that the rotary dial module 1 which had been attached to the upper portion of the base module 2 is detached from the upper portion of the base module 2.

In this case, a magnetic force when the rotary dial module 1 is magnetically attached to the upper portion of the base module 2 may be greater than the magnetic force when the rotary dial module 1 is detached from the upper portion of the base module 2.

FIGS. 3A and 3B are diagrams for describing a rotary dial module and a base module included in a rotary switch device for a vehicle according to an embodiment of the present disclosure.

Referring to FIG. 3A, a touch screen 3 may be provided in an upper portion of the rotary dial module 1.

The rotary dial module 1 may be rotated left and right, and configured such that an operator may experience a change in operational feeling when the rotary dial module 1 is rotated left and right.

When the rotary dial module 1 transmits information on a user's function selection to the base module 2 only through wireless communication with the base module 2, the rotary dial module 1 may include a wireless communication module.

In addition, when the rotary dial module 1 supports both wired/wireless communications with the base module 2, a magnetic pin may be disposed on a lower portion of the rotary dial module 1.

Referring to FIG. 3B, the base module 2 may turn on a light indicator in a region to which the rotary dial module 1 is to be attached or has been attached.

In this case, when the rotary dial module 1 is close to the base module 2, that is, when the distance between the rotary dial module 1 and the base module 2 is within a preset distance, the base module 2 may turn on a light indicator in a region to which the rotary dial module 1 is to be attached, among an upper area of the base module 2.

In addition, when the rotary dial module 1 is detached from the base module 2, that is, when the distance between the rotary dial module 1 and the base module 2 is out of the preset distance, the base module 2 may turn off the light indicator in a region to which the rotary dial module 1 has been attached, among the upper area of the base module 2.

Figure 4:
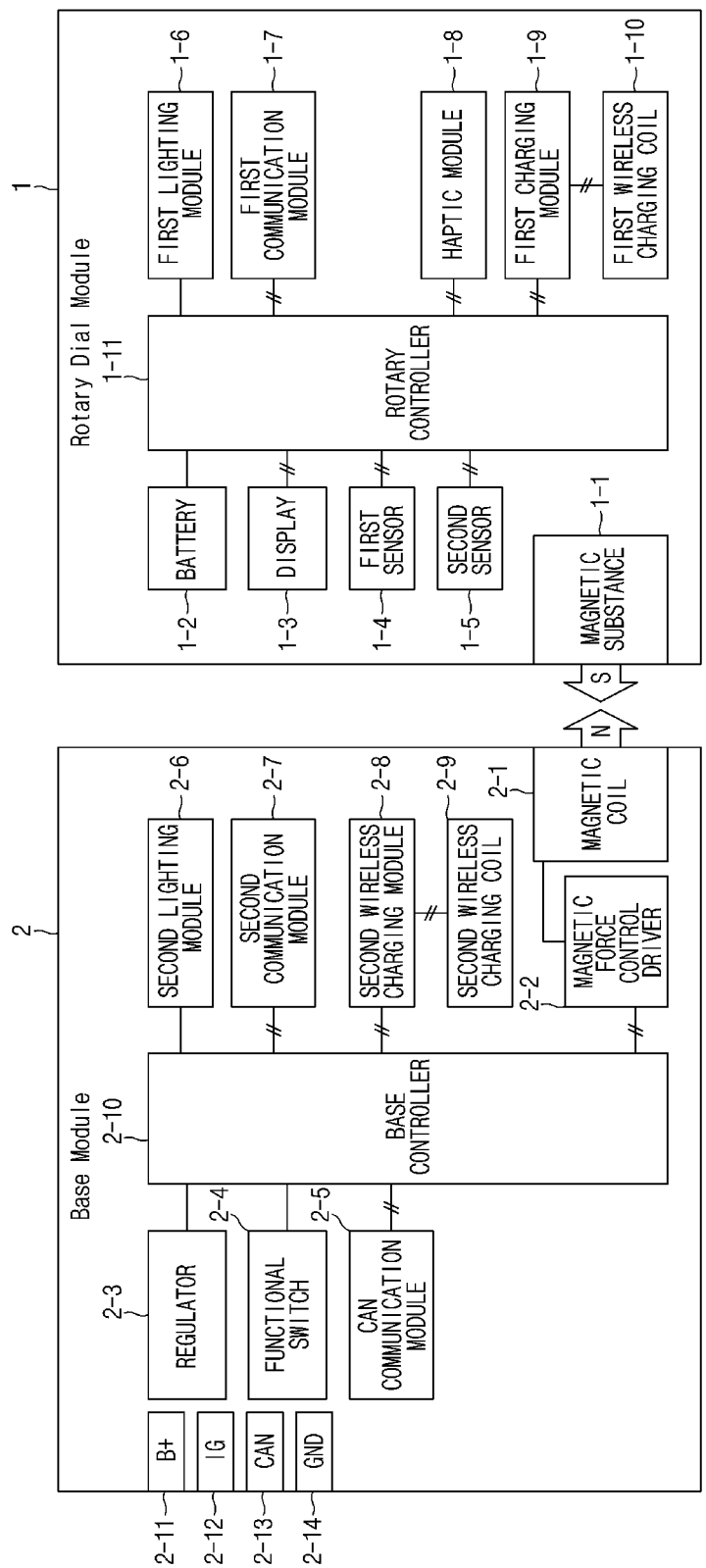
FIG. 4 is a diagram showing a detailed configuration of a rotary switch device for a vehicle according to an embodiment of the present disclosure.

FIG. 4 is a diagram showing a detailed configuration of a rotary switch device for a vehicle according to an embodiment of the present disclosure.

Referring to FIG. 4, the rotary dial module 1 may include a material 1-1 configured to react to magnetic force, a battery 1-2, a display 1-3, a plurality of sensors (e.g., first and second sensors 1-4 and 1-5), a first lighting module 1-6, a first communication module 1-7, a haptic module 1-8, a first wireless charging module 1-9, a first wireless charging coil 1-10, and a rotary controller 1-11.

In this case, the rotary dial module 1 may further include a regulator, and at least one or more components constituting the rotary dial module 1 may receive a stable voltage (power) from the regulator.

The material configured to react to the magnetic force may include a material that is attracted by the magnetic force.

For example, the material 1-1 configured to react to the magnetic force may include a magnetic substance, and more specifically, the magnetic substance 1-1 may include a permanent magnet. In this case, the magnetic substance 1-1 may have a polarity opposite to the magnetic pole of the base module 2. In addition, the magnetic substance 1-1 may include a material (e.g., iron) capable of being attached to the base module 2 by reacting to the magnetic force of the base module 2.

The battery 1-2 may store electrical energy, and provide, through the rotary controller 1-11, stored electrical energy to at least one of the display 1-3, the plurality of sensors 1-4 and 1-5, first lighting module 1-6, the first communication module 1-7 and the haptic module 1-8.

The display 1-3 may be disposed on the upper portion of the rotary dial module 1 as shown in FIG. 3A, and may include a display capable of receiving a touch input.

Each of the plurality of sensors 1-4 and 1-5 may include an acceleration sensor, a gyro sensor, a touch sensor, and a pressure sensor.

The first lighting module 1-6 may turn on a light indicator in a specific portion of the rotary dial module 1.

The first communication module 1-7 may transmit an input from the rotary dial module 1 to the base module 2 using wired/wireless communication.

The haptic module 1-8 may generate vibrations of different patterns according to a combination of the intensity of vibration and the duration of the vibration to enable a user to tactilely check whether the touch input from the rotary dial module 1 is properly input.

The first wireless charging module 1-9 and the first wireless charging coil 1-10 may receive a magnetic field generated from the base module 2 using an electromagnetic induction phenomenon, and generate a current based on the received magnetic field.

The rotary controller 1-11 may charge the battery 1-2 using a current provided from the first wireless charging module 1-9, or provide a current to at least one or more of the display 1-3, the plurality of sensors 1-4 and 1-5, the first lighting module 1-6, the first communication module 1-7 and the haptic module 1-8.

In addition, the rotary controller 1-11 may receive a driver's or passenger's input (i.e., an input from a vehicle occupant) from the display 1-3 and the plurality of sensors 1-4 and 1-5, and transfer the driver's or passenger's input to the base module 2 through the first communication module 1-7.

The rotary controller 1-11 may control the display 1-3 and the first lighting module 1-6 to provide visual information to the driver or passenger, and control the haptic module 1-8 to provide tactile information to the driver or passenger.

The base module 2 may include a magnetic coil 2-1, a magnetic force control driver 2-2, a regulator 2-3, a functional switch 2-4, a CAN communication module 2-5, a second lighting module 2-6, a second communication module 2-7, a second wireless charging module 2-8, a second wireless charging coil 2-9, a base controller 2-10, and a plurality of ports 2-11, 2-12, 2-13, and 2-14.

The magnetic coil 2-1 and the magnetic force control driver 2-2 may generate a magnetic force emitting from the upper portion of the base module 2 and control a magnitude of the magnetic force.

In this case, the magnetic coil 2-1 may receive a current from the magnetic force control driver 2-2 to generate a magnetic force, and may change the magnitude of the generated magnetic force according to a strength of the received current.

In addition, the magnetic force control driver 2-2 may control the amount and strength of the current provided to the magnetic coil 2-1 according to the control of the base controller 2-10.

The regulator 2-3 may provide a stable voltage of a preset level to at least one or more of the magnetic force control driver 2-2, the functional switch 2-4, the CAN communication module 2-5, the second lighting module 2-6, the second communication module 2-7, the second wireless charging module 2-8, and the base controller 2-10.

The functional switch 2-4 may include a switch for selecting one of a switch required for control of electronic devices disposed inside a vehicle or a function of the rotary switch device for a vehicle according to an embodiment of the present disclosure.

The CAN communication module 2-5 may transmit/receive data, information, signals or the like to and from the electronic devices disposed inside the vehicle.

The second lighting module 2-6 may turn on a light indicator in a specific portion of the base module 2.

For example, the second lighting module 2-6 may turn on a light indicator at a position where the rotary dial module 1 is to be attached to the upper portion of the base module 2.

The second communication module 2-7 may transmit/receive data, information, signals or the like to and from the first communication module 1-7 of the rotary dial module 1. In this case, a wireless communication technology such as Bluetooth, Near Field Communication (NFC), and Wi-Fi may be used, or a wired communication technology such as serial communication may be used.

The second wireless charging module 2-8 and the second wireless charging coil 2-9 may generate a magnetic field based on the control of the base controller 2-10.

The base controller 2-10 may transmit, to the rotary dial module 1, the driver's or passenger's input from the functional switch 2-4 and data and signals of the electronic device inside the vehicle received from the CAN communication module 2-5 or transmit, to the electronic device inside the vehicle, information according to the driver's or passenger's input from the functional switch 2-4 and the driver's or passenger's operation of the rotary dial module 1.

Also, the base controller 2-10 may transmit data, information, and signals provided from the rotary dial module 1 to the electronic device inside the vehicle through the CAN communication module 2-5.

When the rotary dial module 1 is close to the base module 2, that is, when the distance between the base module 2 and the rotaly dial module 1 is within a preset distance, the base controller 2-10 may control the second wireless charging module 2-8 such that a magnetic field is generated from the second wireless charging coil 2-9.

The base controller 2-10 may change the magnitude of the magnetic force generated from the magnetic coil 2-1 through the magnetic force control driver 2-2 based on an input from the functional switch 2-4, or data, information and/or signals provided from the CAN communication module 2-5.

In addition, the base controller 2-10 may change the magnitude of the magnetic force generated from the magnetic coil 2-1 through the magnetic force control driver 2-2 based on data, information and/or signals provided from the rotaly dial module 1. In this case, the data, information and/or signals provided from the rotary dial module 1 may be a touch input from the display 1-3 and a sensing input from the plurality of sensors 1-4 and 1-5, and may be input by the driver or the passenger.

The plurality of ports 2-11, 2-12, 2-13, and 2-14 may include the power terminals 2-11 (B+), the ignition confirmation information receiving terminals 2-12 (IG), the CAN communication terminal 2-13 (CAN), and the ground terminal 2-14 (GND). In this case, some of the plurality of ports 2-11, 2-12, 2-13, and 2-14 may be electrically connected to at least one or more of the magnetic coil 2-1, the magnetic force control driver 2-2, the regulator 2-3, the functional switch 2-4, the CAN communication module 2-5, the second lighting module 2-6, the second communication module 2-7, and the second wireless charging module 2-8.

Figure 5:
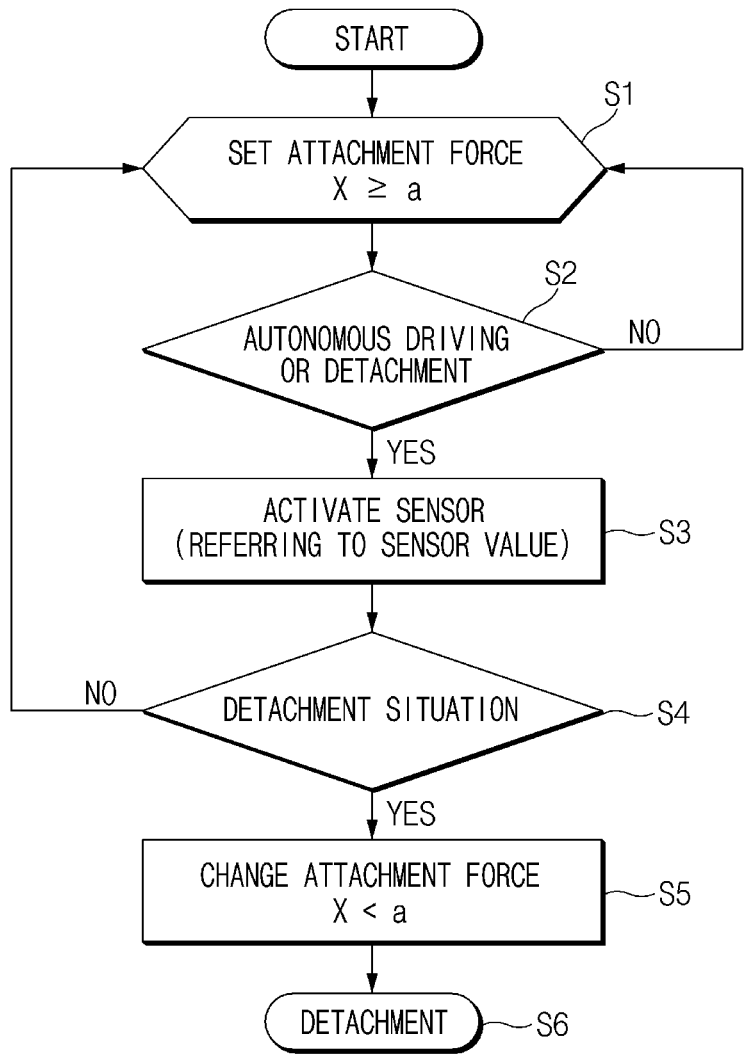
FIG. 5 is a flowchart for describing operation of a rotary switch device for a vehicle according to an embodiment of the present disclosure.

FIG. 5 is a flowchart for describing operation of a rotary switch device for a vehicle according to an embodiment of the present disclosure.

Referring to FIG. 5, a method for operating the rotary switch device for a vehicle according to an embodiment of the present disclosure may include an attachment force setting step S1, an attachment maintenance determination step S2, a sensor activation step S3, a detachment situation determination step S4, an attachment force change step S5 and a detachment step S6.

The attachment force setting step S1 may include generating and maintaining a magnetic force (X) greater than a threshold value "a" through the magnetic coil 2-1 of the base module 2 when the rotary dial module 1 is close to the base module 2, that is, the distance between the base module 2 and the rotary dial module 1 is within a preset distance or when the rotary dial module 1 is attached to the base module 2.

In this case, the magnetic force greater than or equal to the threshold value "a" generated in the base module 2 may prevent the rotary dial module 1 from being unintentionally removed.

In the attachment maintenance determination step S2, it may be determined whether a vehicle is in automated driving mode (autonomous driving mode) or a preset detachment condition is satisfied.

When it is determined in the attachment maintenance determination step S2 that the vehicle is not in automated driving mode or that the preset detachment condition is not satisfied (No), the attachment force setting step S1 is performed again to allow the base module 2 to generate a magnetic force greater than or equal to the threshold value "a".

On the other hand, when it is determined in the attachment maintenance determination step S2 that the vehicle is in automated driving mode or the detachment condition is satisfied (Yes), the sensor activation step S3 may be performed.

In this case, the determination that the vehicle is in the autonomous driving mode may be performed by receiving signals from electronic devices operating during autonomous driving, such as determination of whether a seat is rotated or whether a smart cruise control is operated. In addition, the detachment condition may refer to entering a detachment mode through the functional switch 2-4 or an input from the rotary dial module 1.

The sensor activation step S3 may include activating the sensors of the rotary dial module 1. In this case, the sensor activation step S3 may include activating the plurality of sensors 1-4 and 1-5 included in the rotary dial module 1 and transmitting sensed information from the plurality of activated sensors 1-4 and 1-5 to the base module 2.

In this case, the plurality of activated sensors 1-4 and 1-5 may include at least one or more of an acceleration sensor, a gyro sensor, a touch sensor, and a pressure sensor.

The detachment situation determination step S4 may include determining a detachment situation based on detection results provided from the activated sensors.

For example, the detachment situation determination step S4 may be performed by detecting a pressure greater than or equal to a preset value from the pressure sensor of the rotary dial module 1, detecting a change in position of the rotary dial module 1 from the acceleration sensor or the gyro sensor, or detecting an input for detachment from the touch sensor, based on the detection result provided from the activated sensors.

When a detachment situation is determined in the detachment situation determination step S4 (Yes), the attachment force change step S5 may be performed.

When the detachment situation is not determined in the detachment situation determination step S4 (No), the attachment force setting step S1 may be performed.

The attachment force change step S5 may include changing the magnetic force (X) generated in the base module 2 to be less than the threshold value "a".

The detachment step S6 may include detaching the rotary dial module 1 attached to the base module 2 in a state in which the magnetic force is changed to be less than the threshold value.

As described above, in the rotary switch device for a vehicle according to the embodiment of the present disclosure, the attachment or detachment of the rotary dial module 1 may be performed according to the magnitude of the magnetic force generated in the base module 2.

In addition, the rotary switch device of the vehicle according to the embodiment of the present disclosure may prevent the rotary dial module 1 attached to the base module 2 from being unintentionally detached from the base module 2 by maintaining the magnitude of the magnetic force above a threshold value according to a situation of the vehicle (a situation in which the vehicle is not in an autonomous driving mode or a detachment condition is not satisfied).

FIG. 6 is a view for describing a base module provided in a rotary switch device for a vehicle according to another embodiment of the present disclosure.

Referring to FIG. 6, the base module 2 provided in the rotary switch device for a vehicle according to another embodiment of the present disclosure may include a first magnetic force generating region 1 and a second magnetic force generating region 2 in a region where the rotary dial module 1 is to be attached.

The first magnetic force generating region 1 of the base module 2 may be a region for determining whether attachment to the rotary dial module 1 occurs.

For example, the first magnetic force generating region 1 of the base module 2 may be a region in which a magnetic force (X) greater than or equal to the threshold value "a" is generated when attachment to the rotary dial module 1 occurs, and the magnetic force (X) is changed to less than the threshold value "a" when the detachment situation occurs.

When the rotary dial module 1 is attached to the base module 2 and operated (rotated), the second magnetic force generating region 2 of the base module 2 may be a region in which the magnetic force (X) is generated to cause an operational feeling with respect to the rotation of the rotary dial module 1.

For example, the second magnetic force generating region 2 of the base module 2 may be a region in which the magnetic force (X) is generated only when the rotary dial module 1 is attached to the base module 2 and operated (rotated) and the magnitude of the magnetic force (X) is repeatedly increased and/or decreased. In this case, a change in the magnetic force of the second magnetic force generating region 2 in which the magnitude of the magnetic force is repeatedly increased and decreased may be expressed as Bn.

Figure 7:
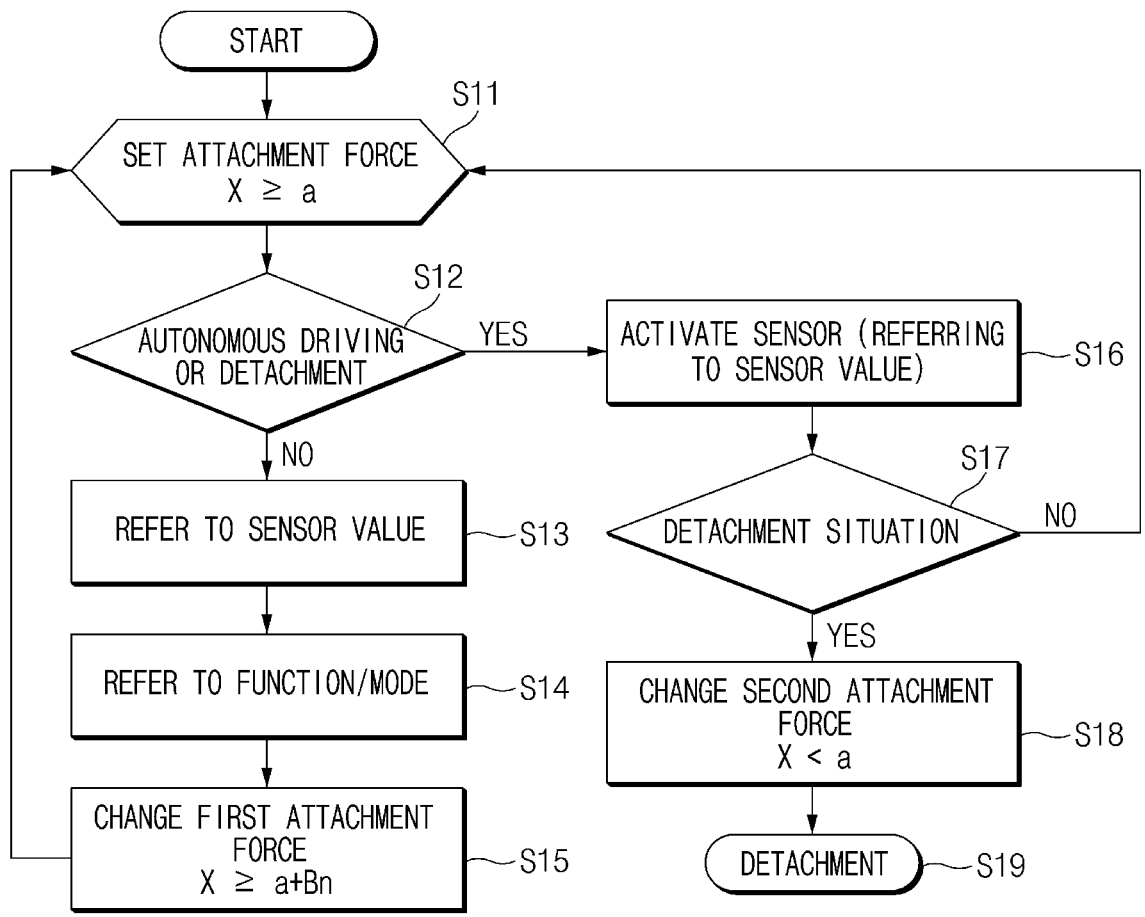
FIG. 7 is a flowchart for describing operation of a rotary switch device for a vehicle according to another embodiment of the present disclosure.

FIG. 7 is a flowchart for describing operation of a rotary switch device for a vehicle according to another embodiment of the present disclosure.

FIG. 7 may illustrate a flowchart for describing the operation of the rotary switch device for the vehicle according to the present disclosure when the first and second magnetic force generating regions 1 and 2 are included in the base module 2.

Referring to FIG. 7, a method of operating a rotary switch device for a vehicle according to another embodiment of the present disclosure may include an attachment force setting step S11, an attachment maintenance determination step S12, a sensor detection step S13, a function and mode detection step S14, a first attachment force change step S15, a sensor activation step S16, a detachment situation determination step S17, a second attachment force change step S18, and a detachment step S19.

The attachment force setting step S11 may include generating and maintaining a magnetic force (X) greater than a threshold value "a" through the magnetic coil 2-1 of the base module 2 when the rotary dial module 1 is close to the base module 2, that is, the distance between the base module 2 and the rotary dial module 1 is within a preset distance or when the rotary dial module 1 is attached to the base module 2.

In this case, the magnetic force greater than or equal to the threshold value "a" generated in the base module 2 may prevent the rotary dial module 1 from being unintentionally removed.

In the attachment maintenance determination step S12, it may be determined whether a vehicle is not in an automated driving mode (normal driving mode) or a preset detachment condition is satisfied.

When it is determined in the attachment maintenance determination step S12 that the vehicle is in the normal driving mode rather than in the automated driving mode or the preset detachment condition is not satisfied (No), the sensor detection step S13 may be performed.

On the other hand, when it is determined in the attachment maintenance determination step S12 that the vehicle is in an automated driving mode or the detachment condition is satisfied (Yes), the sensor activation step S16 may be performed.

In this case, the determination that the vehicle is in the autonomous driving mode may be performed by receiving signals from electronic devices operating during autonomous driving, such as determination of whether a seat is rotated or whether a smart cruise control is operated. In addition, the detachment condition may refer to entering a detachment mode through the functional switch 2-4 or an input from the rotary dial module 1.

The sensor detection step S13 may include activating a plurality of sensors provided in the rotary dial module 1 and receiving detection results from the activated sensors.

For example, the sensor detection step S13 may include detecting an input of a driver or a passenger from activated sensors.

The function and mode detection step S14 may include selecting a function or mode corresponding to the driver's or passenger's input detected in the sensor detection step S13.

The first attachment force change step S15 may include generating a vibration pattern corresponding to the function or mode selected in the function and mode detection step S14.

For example, the first attachment force change step S15 may be a step of additionally generating a magnetic force in addition to the magnetic force (X) equal to or greater than the threshold value "a" generated in the attachment force setting step S11 and the first attachment force change step S15 may include repeatedly increasing and then decreasing the magnitude (Bn) of an additionally generated magnetic force.

In this case, the magnitude of the magnetic force generated by the base module 2 in the first attachment force change step S15 may be expressed as "a+Bn".

The first attachment force change step S15 may be maintained for a preset period of time, and the attachment force setting step S11 may be performed again after completion of the first attachment force change step S15.

The sensor activation step S16 may be performed when it is determined that the vehicle is in the automated driving mode and the detachment condition is satisfied in the attachment maintenance determination step S12 (Yes).

The sensor activation step S16 may include activating the sensors of the rotary dial module 1. In this case, the sensor activation step S16 may include activating the plurality of sensors 1-4 and 1-5 included in the rotary dial module 1 and transmitting detected information from the plurality of activated sensors 1-4 and 1-5 to the base module 2.

In this case, the plurality of sensors 1-4 and 1-5 activated may include at least one or more of an acceleration sensor, a gyro sensor, a touch sensor, and a pressure sensor.

When a pressure sensor exists among the plurality of activated sensors 1-4 and 1-5, the pressure detected in the sensor activation step S16 may be detected as being greater than the pressure detected in the sensor detection step S13.

The reason for this is that a driver or an passenger may touch the rotary dial module 1 with a greater force than that when operating the rotary dial module 1, for detachment of the rotary dial module 1 attached to the base module 2.

The detachment situation determination step S17 may include determining detachment based on detection results provided from the activated sensors.

For example, the detachment situation determination step S17 may be performed by detecting a pressure greater than or equal to a preset value from the pressure sensor of the rotary dial module 1, detecting a change in position of the rotary dial module 1 from the acceleration sensor or the gyro sensor, or detecting an input for detachment from the touch sensor, based on the detection result provided from the activated sensors.

When the detachment situation is determined in the detachment situation determination step S17 (Yes), the second attachment force change step S18 may be performed.

When the detachment situation is not determined in the detachment situation determination step S17 (No), the attachment force setting step S11 may be performed.

The second attachment force change step S18 may include changing the magnetic force (X) generated in the base module 2 to be less than the threshold value.

The detachment step S19 may include detaching the rotary dial module 1 attached to the base module 2 in a state in which the magnetic force is changed to be less than the threshold value.

As described above, in the rotary switch device for a vehicle according to another embodiment of the present disclosure, when operation is applied to the rotary dial module 1 in a state in which the rotary dial module 1 is attached to the base module 2 (X>=a), an additional magnetic force may be generated in addition to the magnetic force maintained above the threshold value. In this case, the magnetic force is additionally generated in such a way to repeatedly increase and decrease the magnitude of the magnetic force.

Figure 8:
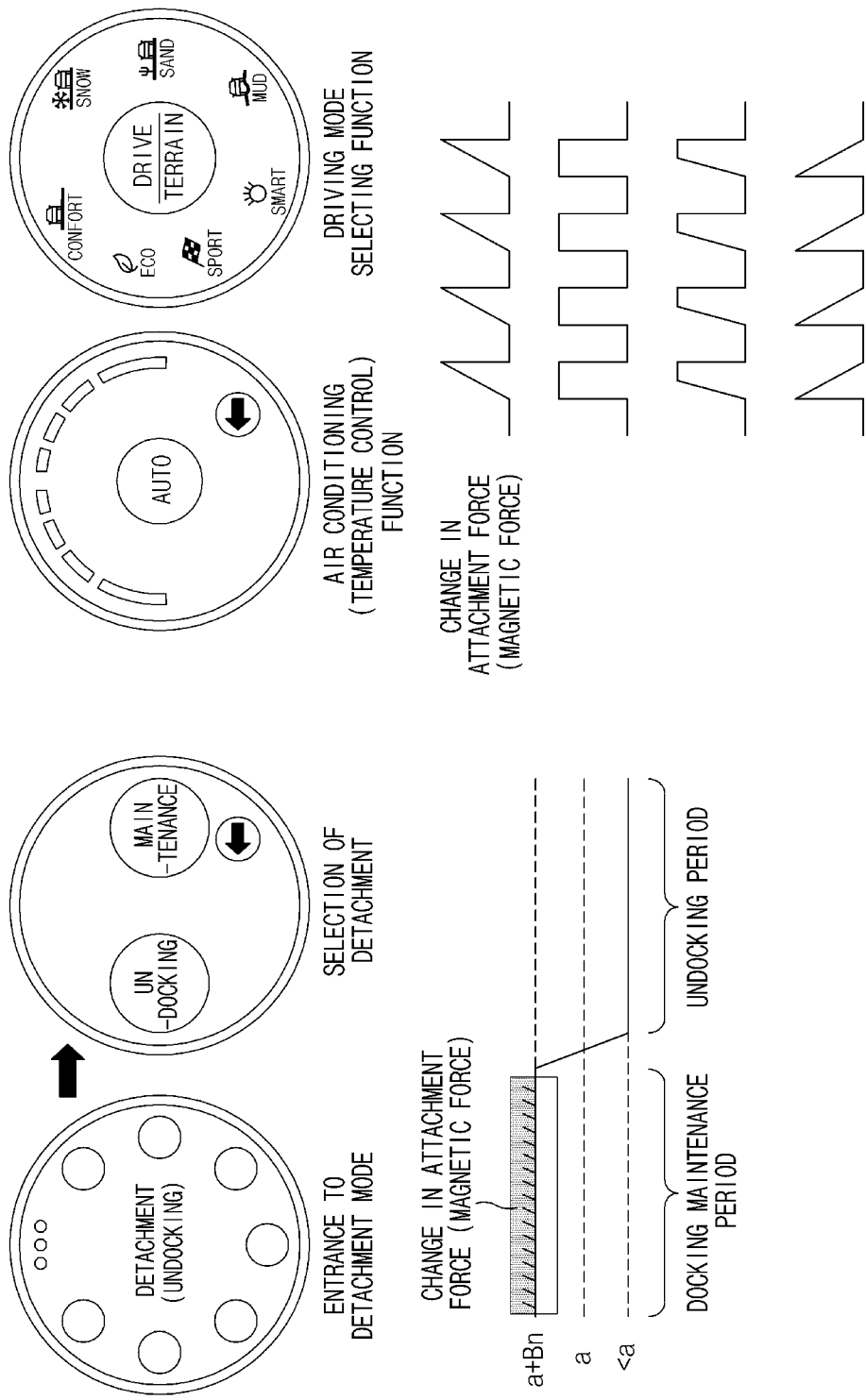
FIG. 8 is a diagram for describing a function and an operation of a rotary switch device for a vehicle according to an embodiment of the present disclosure.

FIG. 8 is a diagram for describing a function and an operation of a rotary switch device for a vehicle according to an embodiment of the present disclosure.

Referring to FIG. 8, the detachment mode may be entered through a touch-type display disposed on the upper portion of the rotary dial module 1, that is, on the front side of the rotary dial module 1.

While the rotary dial module 1 is attached (docked) to the base module 2, the base module 2 may maintain the magnetic force to be greater than or equal to the threshold value "a", and when the operation of the rotary dial module 1 is detected, additionally generate the magnetic force (Bn) whose the magnitude is being repeatedly increased and decreased.

The change in the additionally generated magnetic force may appear in various pulse patterns.

The above description is merely illustrative of the technical idea of the present disclosure, and various modifications and variations may be made without departing from the essential characteristics of the present disclosure by those skilled in the art to which the present disclosure pertains.

Therefore, the exemplary embodiments of the present disclosure are provided to explain the spirit and scope of the present disclosure, but not to limit them, so that the spirit and scope of the present disclosure is not limited by the embodiments. The scope of protection of the present disclosure should be interpreted by the following claims, and all technical ideas within the scope equivalent thereto should be construed as being included in the scope of the present disclosure.

According to the embodiments of the present disclosure, it is possible to secure operability and accessibility in various usage environments of autonomous vehicles such as seat rotation, by providing a multi-function touch-type rotary switch device capable of stable attachment and easy detachment.

In addition, various effects may be provided that are directly or indirectly understood through the disclosure.

Hereinabove, although the present disclosure has been described with reference to exemplary embodiments and the accompanying drawings, the present disclosure is not limited thereto, but may be variously modified and altered by those skilled in the art to which the present disclosure pertains without departing from the spirit and scope of the present disclosure claimed in the following claims.

What is claimed is:

1. A rotary switch device for a vehicle, the rotary switch device comprising:
   a rotary dial module including a plurality of sensors and a material configured to react to a magnetic force; and
   a base module configured to generate a magnetic force greater than or equal to a threshold value to enable the rotary dial module to be attached to the base module and transmit detection results from the plurality of sensors included in the rotary dial module to an electronic device inside the vehicle when the rotary dial module is attached to the base module;
   wherein the base module comprises a magnetic coil configured to generate the magnetic force according to a received current; and
   wherein the rotary dial module is detached from the base module when the magnetic force generated by the magnetic coil is less than the threshold value.

2. The rotary switch device of claim 1, wherein the rotary dial module includes a display disposed in an upper portion of the rotary dial module and a magnetic substance in a lower portion of the rotary dial module.

3. The rotary switch device of claim 1, wherein the rotary dial module further includes a battery that is wirelessly charged according to a magnetic field generated by the base module when attached to the base module.

4. The rotary switch device of claim 1, wherein the rotary dial module further includes:
   a lighting module configured to turn on a light indicator in a specific portion, and
   a communication module configured to communicate with the base module.

5. The rotary switch device of claim 1, wherein the rotary dial module further includes a haptic module configured to generate a vibration pattern corresponding to a function selected by the plurality of sensors.

6. The rotary switch device of claim 1, wherein the base module further comprises:
   a magnetic force control driver configured to control the current provided to the magnetic coil;
   a communication module configured to communicate with the rotary dial module;
   a lighting module configured to turn on a light indicator in a portion to which the rotary dial module is to be attached;
   a CAN communication module configured to communicate with the electronic device inside the vehicle, and
   a functional switch configured to transmit an operational input of an occupant.

7. The rotary switch device of claim 1, wherein the base module includes:
   a first magnetic force generating region in which the magnetic force for attachment of the rotary dial module is generated, and
   a second magnetic force generating region in which a magnetic force is additionally generated to provide operational feeing when the rotary dial module is rotated.

8. The rotary switch device of claim 7, wherein the second magnetic force generating region is a region in which a magnetic force is additionally generated in the form of a pulse in which a magnitude of the magnetic force repeatedly increases and decreases.

9. A method for operating a rotary switch device for a vehicle, the method comprising:
   an attachment force setting step of generating and maintaining a magnetic force greater than or equal to a threshold value, by providing a current to a magnetic coil, when a rotary dial module is attached to an upper portion of a base module;

an attachment maintenance determination step of determining whether the vehicle is in an autonomous driving mode or a detachment condition is satisfied;

a sensor activation step of activating sensors included in the rotary dial module and receiving detection results of the activated sensors, when it is determined in the attachment maintenance determination step that the vehicle is in an autonomous driving mode or the detachment condition is satisfied;

a detachment situation determination step of determining a detachment situation based on the detection results in the sensor activation step; and a first attachment force change step of changing the magnetic force to be less than the threshold value, by controlling the current to the magnetic coil of the base module, when the detachment situation is determined in the detachment situation determination step.

10. The method of claim 9, wherein the detachment condition includes entrance to a detachment mode through an input from a functional switch of the base module or the sensors of the rotary dial module.

11. The method of claim 9, wherein the detachment situation includes a situation in which a pressure greater than or equal to a preset pressure is detected based on the detection results provided from the sensors of the rotary dial module, a situation in which a change of position of the rotary dial module is detected, or a situation in which a touch input is determined as a detachment input.

12. The method of claim 9, further comprising:

a sensor detection step of activating the plurality of sensors included in the rotary dial module and receiving the detection results provided from the plurality of sensors when it is determined in the attachment maintenance step that the vehicle is not in an autonomous driving mode or the detachment condition is not satisfied, a function and mode selection step of selecting a function or mode corresponding to the detection results received in the sensor detection step, and a second attachment force change step of additionally generating a magnetic force whose magnitude is repeatedly increased or decreased.

* * * * *